(12) United States Patent
Yu et al.

(10) Patent No.: US 10,950,677 B2
(45) Date of Patent: Mar. 16, 2021

(54) ARRAY SUBSTRATE, MANUFACTURING METHOD THEREOF, AND DISPLAY PANEL

(71) Applicant: Wuhan China Star Optoelectronics Semiconductor Display Technology Co., Ltd., Wuhan (CN)

(72) Inventors: Yun Yu, Wuhan (CN); Weiwei Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/462,546

(22) PCT Filed: Jan. 11, 2019

(86) PCT No.: PCT/CN2019/071346
§ 371 (c)(1),
(2) Date: May 21, 2019

(87) PCT Pub. No.: WO2020/113771
PCT Pub. Date: Jun. 11, 2020

(65) Prior Publication Data
US 2020/0185478 A1    Jun. 11, 2020

(30) Foreign Application Priority Data
Dec. 5, 2018 (CN) .......................... 201811481754.8

(51) Int. Cl.
*H01L 27/32* (2006.01)
*G06F 1/16* (2006.01)
(Continued)

(52) U.S. Cl.
CPC ........ *H01L 27/3258* (2013.01); *G06F 1/1652* (2013.01); *G09F 9/301* (2013.01);
(Continued)

(58) Field of Classification Search
None
See application file for complete search history.

(56) References Cited

U.S. PATENT DOCUMENTS

| 8,222,646 | B2 * | 7/2012 | Wong ..................... H01L 29/458 257/66 |
| 2016/0079440 | A1 * | 3/2016 | Ellinger .............. H01L 29/7869 257/43 |

(Continued)

FOREIGN PATENT DOCUMENTS

| CN | 105140238 | 0/2015 |
| CN | 101226964 | 7/2008 |

(Continued)

*Primary Examiner* — Long Pham

(57) ABSTRACT

The present disclosure provides an array substrate and a manufacturing method of the array substrate, and a display panel. The array substrate includes a flexible substrate; an active layer disposed on the flexible substrate; a first gate insulating layer disposed on the active layer; a first gate layer disposed on the first gate insulating layer; a second gate insulating layer disposed on the first gate insulating layer and the first gate layer; and a second gate layer disposed on the second gate insulating layer. The array substrate of the present disclosure replaces molybdenum wires of a gate layer and a second gate layer with a multi-layered composite metal layer. The bending tolerance of gate wires in the display panel is enhanced and increase of impedance of the first gate layer is prevented.

4 Claims, 4 Drawing Sheets

(51) Int. Cl.
*H01L 51/00* (2006.01)
*H01L 51/56* (2006.01)
*G09F 9/30* (2006.01)

(52) U.S. Cl.
CPC .......... *H01L 51/0097* (2013.01); *H01L 51/56* (2013.01); *H01L 2227/323* (2013.01)

(56) References Cited

U.S. PATENT DOCUMENTS

| | | | |
|---|---|---|---|
| 2017/0170198 A1 | 6/2017 | Wang et al. | |
| 2018/0033849 A1* | 2/2018 | Noh | H01L 27/1222 |
| 2018/0366586 A1* | 12/2018 | Son | H01L 27/3276 |
| 2020/0020756 A1* | 1/2020 | Ueda | H01L 29/423 |
| 2020/0203455 A1* | 6/2020 | Xie | H01L 27/3258 |
| 2020/0243635 A1* | 7/2020 | Lee | G09G 3/3266 |
| 2020/0243637 A1* | 7/2020 | Lee | H01L 23/5286 |
| 2020/0273940 A1* | 8/2020 | Byun | H01L 27/326 |
| 2020/0287052 A1* | 9/2020 | Qu | H01L 27/3276 |
| 2020/0312932 A1* | 10/2020 | Kim | H01L 27/3248 |

FOREIGN PATENT DOCUMENTS

| | | |
|---|---|---|
| CN | 106098528 | 11/2016 |
| CN | 107910302 | 4/2018 |

\* cited by examiner

ARRAY SUBSTRATE, MANUFACTURING METHOD THEREOF, AND DISPLAY PANEL

RELATED APPLICATIONS

This application is a National Phase of PCT Patent Application No. PCT/CN2019/071346 having International filing date of Jan. 11, 2019, which claims the benefit of priority of Chinese Patent Application No. 201811481754.8 filed on Dec. 5, 2018. The contents of the above applications are all incorporated by reference as if fully set forth herein in their entirety.

FIELD AND BACKGROUND OF THE INVENTION

The present disclosure relates to a field of flexible display device technology, particular to a field of an array substrate, a manufacturing method of the array substrate, and a display panel.

Organic light-emitting diode (OLED) displays become a key technology in development of the display field due to their advantages, such as self-illuminating, wide color gamut, low driving voltage, high illuminating efficiency, low power consumption, and fast response times. Especially, OLED displays become a key technology in development of the display field because they are flexible and portable. As a result, flexible array substrates for driving OLED displays become a key developing technology.

The main research aspects are enhancing bending tolerance and achieving high resolution and high yield of flexible array substrates.

Existing flexible array substrates generally include a flexible substrate, a block layer, an active layer, a first gate insulating layer, a first gate layer, a second gate insulating layer, a second gate layer, an interlayer insulating layer, and a source-drain electrode disposed from bottom to top in sequence. The specific manufacturing process is as follows: forming the flexible substrate, depositing the block layer on the flexible substrate, depositing the active layer on the block layer and crystallizing the active layer, then depositing the first gate insulating layer and sputtering deposition the first gate layer on the first gate insulating layer, lithography etching and patterning the first gate layer; p-type heavy doping the active layer by self-alignment process, depositing the second gate insulating layer and sputtering depositing the second gate layer on the second gate insulating layer, lithography etching and patterning the second gate layer, depositing the interlayer insulating layer and then hydrogenated activating the active layer, lithography etching to form a via hole, and depositing a source electrode and a drain electrode.

In the present technology, material composing the first gate layer and the second gate layer is usually molybdenum which has a thickness about 250 nm. The first gate layer and the second gate layer are thicker thus their bending tolerances are lower. Because the first gate layer and the second gate layer are thick, the hydrogenated activating process is usually continuously operated. Higher activation temperatures or higher hydrogenation temperatures make the hydrogenated activating process becomes more difficult.

SUMMARY OF THE INVENTION

To solve the above-mentioned technical problems, the present disclosure provides an array substrate and a manufacturing method of the array substrate, and a display panel which replaces a gate layer from a single molybdenum layer to a multi-layered composite metal layer to solve the fragile and bending tolerance of the gate wires of the present gate layer and solve problems of thicker thickness of the present gate layer under a precondition of same resistance. In the meanwhile, the defects of the manufacturing process of the array substrate are improved.

A technical solution to solve the above technical problems is: providing an array substrate includes a flexible substrate, an active layer, a first gate insulating layer, a first gate layer, a second gate insulating layer, and a second gate layer. The active layer is disposed on the flexible substrate. The first gate insulating layer is disposed on the active layer. The first gate layer is disposed on the first gate insulating layer. The first gate layer is a multi-layered composite metal layer. The second gate insulating layer is disposed on the first gate insulating layer and the first gate layer. The second gate layer is disposed on the second gate insulating layer. The second gate layer is a multi-layered composite metal layer.

In an embodiment of the present disclosure, the multi-layered composite metal layer includes a first metal layer, a second metal layer, and a third metal layer disposed between the first metal layer and the second metal layer. Where the first metal layer and the second metal layer are composed of titanium or molybdenum, and the third metal layer is composed of aluminum.

In the embodiment of the present disclosure, in the multi-layered composite metal layer, a thickness of the third metal layer ranges between 100 nm and 120 nm, and a thickness of the first metal layer and a thickness of the second metal layer both range between 30 nm and 50 nm.

In the embodiment of the present disclosure, material of the active layer includes amorphous silicon, the first gate insulating layer is a silicon oxide layer, a silicon nitride layer, or a multi-layered silicon nitride, and the second gate insulating layer is a silicon oxide layer, a silicon nitride layer, or a multi-layered silicon nitride.

In the embodiment of the present disclosure, the active layer includes a source area and a drain area, the array substrate further includes an interlayer insulating layer disposed on the second gate insulating layer and the second gate layer; a plurality of via holes penetrating from the interlayer insulating layer to the active layer, wherein one of the via holes corresponds to the source area, another one of the via holes corresponds to the drain area; a source electrode disposed on the interlayer insulating layer and connected to the source area through a corresponding via hole; and a drain electrode disposed on the interlayer insulating layer and connected to the drain area through a corresponding via hole. Where the flexible substrate includes a flexible base layer and a block layer disposed on the flexible base layer, wherein the active layer is disposed on the block layer.

The present disclosure further provides a manufacturing method of the array substrate including a step S1 for forming a flexible substrate; a step S2 for depositing an active layer on the flexible substrate and crystalizing the active layer; a step S3 for depositing a first gate insulating layer on the flexible substrate and the active layer; a step S4 for depositing a first gate layer on the first gate insulating layer, image-etching the first gate layer to form a first gate electrode, wherein the first gate layer is a multi-layered metal layer; a step S5 for depositing a second gate insulating layer on the first gate insulating layer and the first gate layer; and a step S6 for depositing a second gate layer on the second gate insulating layer and image-etching the second gate layer to from a second gate electrode; wherein the second gate layer is a multi-layered metal layer.

In the embodiment of the present disclosure, the active layer includes a source area and a drain area. Where the method further includes the following steps between the step S3 and step S4: a step S100 for performing a p-type heavy-doping to the source area and the drain area of the active layer; and a step S200 for activating a p-type heavy-doped source area and a p-type heavy-doped drain area, wherein an activating temperature is 450° C. and an activating duration ranges between 30 minutes and 60 minutes.

In the embodiment of the present disclosure, further following steps are included after the step S6:

In the embodiment of the present disclosure, a step S7 for depositing an interlayer insulating layer on the second gate insulating layer and the second gate layer; a step S8 for hydrogenating the first gate insulating layer and the second gate insulating layer after activating the first gate insulating layer and the second gate insulating layer, wherein a hydrogenation temperature ranges between 330° C. and 370° C., and a hydrogenation duration ranges between 30 minutes and 60 minutes; a step S9 for etching the source area and the drain area to form a plurality of via holes penetrating from the interlayer insulating layer to the active layer; and a step S10 for depositing a source electrode and a drain electrode in the via holes and on the interlayer insulating layer.

In the embodiment of the present disclosure, the multi-layered metal layer includes a first metal layer, a second metal layer, and a third metal layer disposed between the first metal layer and the second metal layer. Where the first metal layer and the second metal layer are composed of titanium or molybdenum, the third metal layer is composed of aluminum.

The present disclosure further provides a display panel includes the array substrate.

The array substrate and the display panel of the present disclosure can effectively improve the bending tolerance of the gate wires in the display panel by replacing the composition of gate wires in the first gate layer and the second gate layer from molybdenum by multi-layered composite metal layer. Meanwhile, under the precondition of having the same impedance, the thicknesses of first gate layer and the second gate layer of the present disclosure are thinner than the present technology. The film thickness is significantly thinner than that of the present technology. Or under the precondition that the thickness of multi-layered composite metal having the same thickness with as present gate layer, the widths of gate wires can be thinner to achieve high-resolution display. The manufacturing method of the array substrate of the present disclosure advances the P-type heavily doping and activation process prior to the deposition of the first gate layer in order to effectively prevent the increase of impedance of the first gate layer after the activation of the first gate layer at a high temperature (activation temperature is generally 450° C., activation duration is 60 minutes). The P-type heavily doping utilizes a first gate electrode mask to achieve doping, thus no extra mask is needed and the manufacturing process is simple and convenient. The activation and hydrogenation processes are separated. After the film formation of the interlayer insulating layer, the low temperature hydrogenation process is operated at 330-370° C., which avoids the continuously expose the first gate layer under the affection caused by high temperature manufacturing process, and ensures the effection of hydrogenation and activation applied to the array substrate.

BRIEF DESCRIPTION OF THE SEVERAL VIEWS OF THE DRAWINGS

In order to more clearly illustrate the technical solutions of the embodiments of the present disclosure, the drawings used in the description of the embodiments will be briefly described below. It is obvious that the drawings in the following description are only some embodiments of the present invention. Other drawings can also be obtained for a skilled person in the art based on these drawings without paying any creative effort.

The present disclosure is further explained below accompanying with drawings and embodiments.

Figure 1:
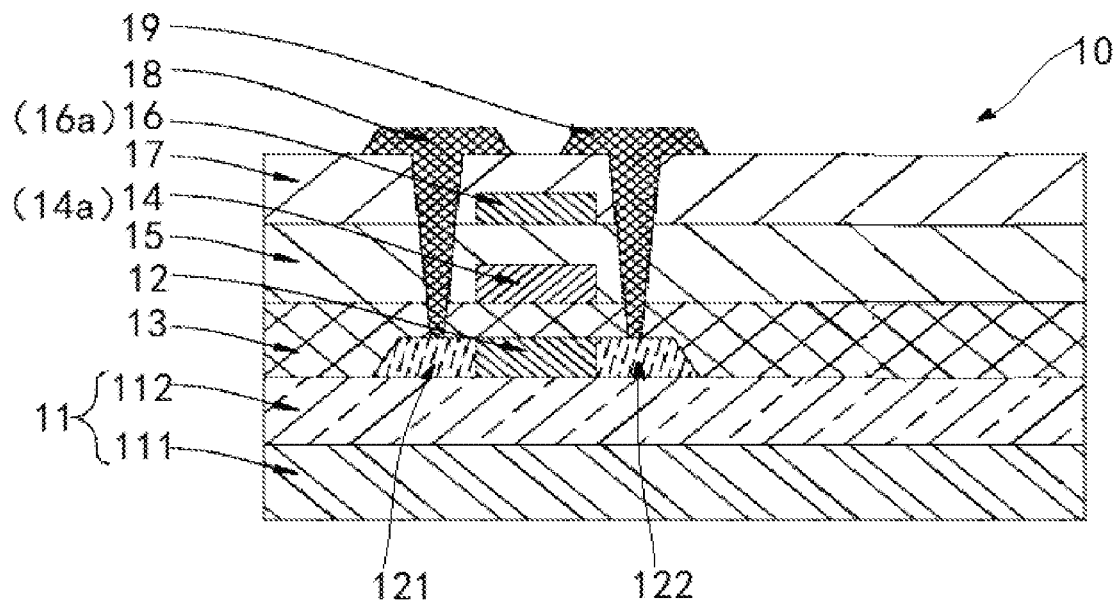
FIG. 1 illustrates a structure of an array substrate of an embodiment of the present disclosure.

| Reference number: | | | |
|---|---|---|---|
| 1 | display panel; | | |
| 2 | multi-layered composite metal layer; | | |
| 10 | array substrate; | 20 | color film substrate; |
| 11 | flexible substrate; | 12 | active layer; |
| 13 | first gate insulating layer; | 14 | first gate layer; |
| 15 | second gate insulating layer; | 16 | second gate layer; |
| 14a | first gate electrode; | | |
| 16a | second gate electrode; | | |
| 17 | interlayer insulating layer; | 18 | source electrode; |
| 19 | drain electrode; | 101 | via-hole; |
| 111 | flexible base layer; | 112 | block layer; |
| 121 | source area; | 122 | drain area; |
| 21 | first metal layer; | 22 | second metal layer |
| 23 | third metal layer. | | |

DESCRIPTION OF SPECIFIC EMBODIMENTS OF THE INVENTION

Embodiments of the present disclosure are described in detail below, and the examples of the embodiments are illustrated in the drawings, wherein the same or similar reference numerals indicate the same or similar elements or elements having the same or similar functions. The embodiments described below accompanying with the drawings are illustrative and are merely illustrative of the present disclosure and are not limited to the present disclosure.

Embodiments illustrated in following description are provided to exemplify the specific embodiments in which the present disclosure may be implemented. Directional terms mentioned in the present disclosure, such as "upper", "lower", "before", "after", "left", "right", "top", "bottom", etc., are only selective references of directions. Therefore, the directional term is used to describe and understand the present disclosure rather than limitations the present disclosure.

As shown in FIG. 1, in an embodiment, an array substrate 10 of the present disclosure includes a flexible substrate 11, an active layer 12, a first gate insulating layer 13, a first gate layer 14, a second gate insulating layer 15, a second gate layer 16, an interlayer insulating layer 17, a source electrode 18, and a drain electrode 19.

The flexible substrate 11 includes a flexible base layer 111 and a block layer 112. The block layer 112 is disposed on the flexible substrate 11, and the active layer 12 is disposed on the block layer 112. Material of the flexible substrate 11 may be a polyimide material. The block layer 112 may be one of a silicon oxide layer, a nitride oxide layer or a multi-layered silicon nitride.

The active layer 12 is disposed on the flexible substrate 11.

The active layer 12 has a source area 121 and a drain area 122. In the present embodiment, material for forming the active layer 12 is amorphous silicon (a-Si). The first gate insulating layer 13 covers the active layer 12. In the present embodiment, the first gate insulating layer 13 is a silicon oxide layer, a nitride oxide layer or multi-layered silicon nitride. The first gate layer 14 is disposed on the first gate insulating layer 13. The first gate layer 14 is a multi-layered composite metal layer 2. The second gate insulating layer 15 covers the first gate insulating layer 13 and the first gate layer 14. In the present embodiment, the second gate insulating layer 15 is a silicon oxide layer, a nitride oxide layer or a multi-layered silicon nitride. The second gate layer 16 is disposed on the second gate insulating layer 15. The second gate layer 16 is a multi-layered composite metal layer 2. The interlayer insulating layer 17 covers the second gate insulating layer 15 and the second gate second gate electrode 16a. The array substrate 10 of the present embodiment further includes via-holes 101 penetrating from the interlayer insulating layer 17 to the active layer 12. One of the via-holes 101 corresponds to the source area 121, and another of the via-holes 101 corresponds to the drain area 122 (please refer to FIG. 2). The source electrode 18 is disposed on the interlayer insulating layer 17 and connected to the source area 121 through a corresponding via-hole 101. The drain electrode 19 is disposed on the interlayer insulating layer 17 and is connected to the drain area 122 through a corresponding via-hole 101.

Figure 3:
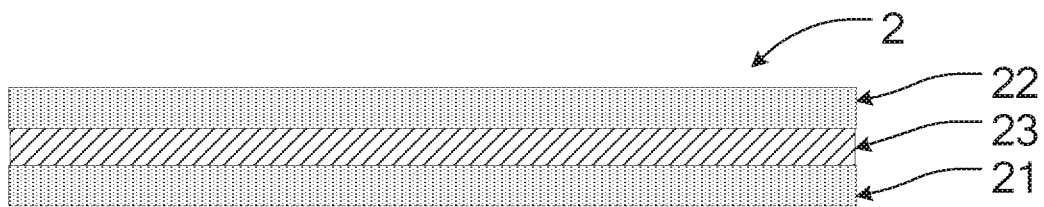
FIG. 3 is a layered structure of a multi-layered composite metal layer of an embodiment of the present disclosure.

Please refer to FIG. 3. The multi-layered composite metal layer 2 includes a first metal layer 21, a second metal layer 22, and a third metal layer 23. The third metal layer 23 is disposed between the first metal layer 21 and the second metal layer 22. The metal for forming the first metal layer 21 and the second metal layer 22 is titanium or molybdenum. The metal used for forming the third metal layer 23 is aluminum.

In the present embodiment, in the multi-layered composite metal layer 2, a thickness of the third metal layer 23 is 100-120 nm and thicknesses of the first metal layer 21 and the second metal layer 22 are 30-50 nm. In the first gate layer 14, the material for forming the first metal layer 21 and the second metal layer 22 is titanium and the material for forming the third metal layer 23 is aluminum. The first gate layer 14 is formed as a titanium-aluminum-titanium metal layered structure. In the second gate layer 16, the material for forming the first metal layer 21 and the second metal layer 22 is molybdenum and the material for forming the third metal layer 23 is aluminum. Therefore, the second gate layer 16 is formed as a molybdenum-aluminum-molybdenum metal layered structure. In comparison with molybdenum, aluminum has lower resistivity and better flexibility, while molybdenum is fragile and its impedance is larger than that of aluminum. In the existing technologies, the thicknesses of the gate layer or the gate layer made of molybdenum are equal to or more than 250 nm. However, in the present embodiment, the gate layer is replaced by the multi-layered composite metal layer 2, even a thickness of the third metal layer 23 (aluminum layer) is between 100-120 nm to achieve the same impedance. In the meanwhile, the first metal layer 21 and the second metal layer 22 can achieve a function of protecting the third metal layer 23.

When utilizing the multi-layered composite metal layer 2 to obtain the same impedance of wires, the thicknesses of films disclosure are significantly thinner than the present technology. Or under the precondition that the thickness of multi-layered composite metal layer 2 have the same thickness as the present gate layer, the widths of gate wires can be minimized to achieve high-resolution display and bending tolerance of wires can be enhanced.

The materials of the multi-layered composite metal layer 2 in the present embodiment are not limited to the above selections. There are still various materials can be selected. For example, in the first gate layer 14, the material for forming the first metal layer 21 and the second metal layer 22 is preferably molybdenum and the material for forming the third metal layer 23 is aluminum. In the second gate layer 16, the material for forming the first metal layer 21 and the second metal layer 22 is titanium and the material for forming the third metal layer 23 is aluminum. Selectively, in the first gate layer 14, the material for forming the first metal layer 21 can be titanium and the material for forming the second metal layer 22 can be molybdenum, and the material for forming the third metal layer 23 can be aluminum. In the second gate layer 16, the material for forming the first metal layer 21 and the second metal layer 22 can be molybdenum and the material for forming the third metal layer 23 can be aluminum. It is obvious that there are other combinations which will not be listed in detail. In the multi-layered composite metal layer 2, the materials for forming the first metal layer 21 and the second metal layer 22 are not limited to titanium or molybdenum, and may be metals, such as silver, copper, and tungsten.

Figure 2:
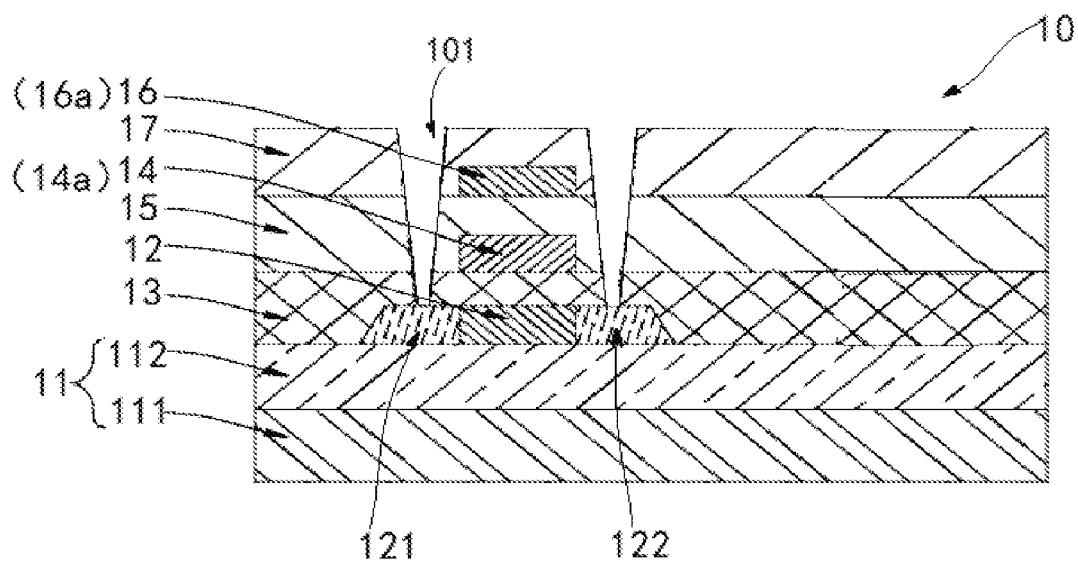
FIG. 2 illustrates a structure of an array substrate of the embodiment of the present disclosure which mainly shows a correspondence between a via-hole, a source area, and a drain area.
Figure 4:
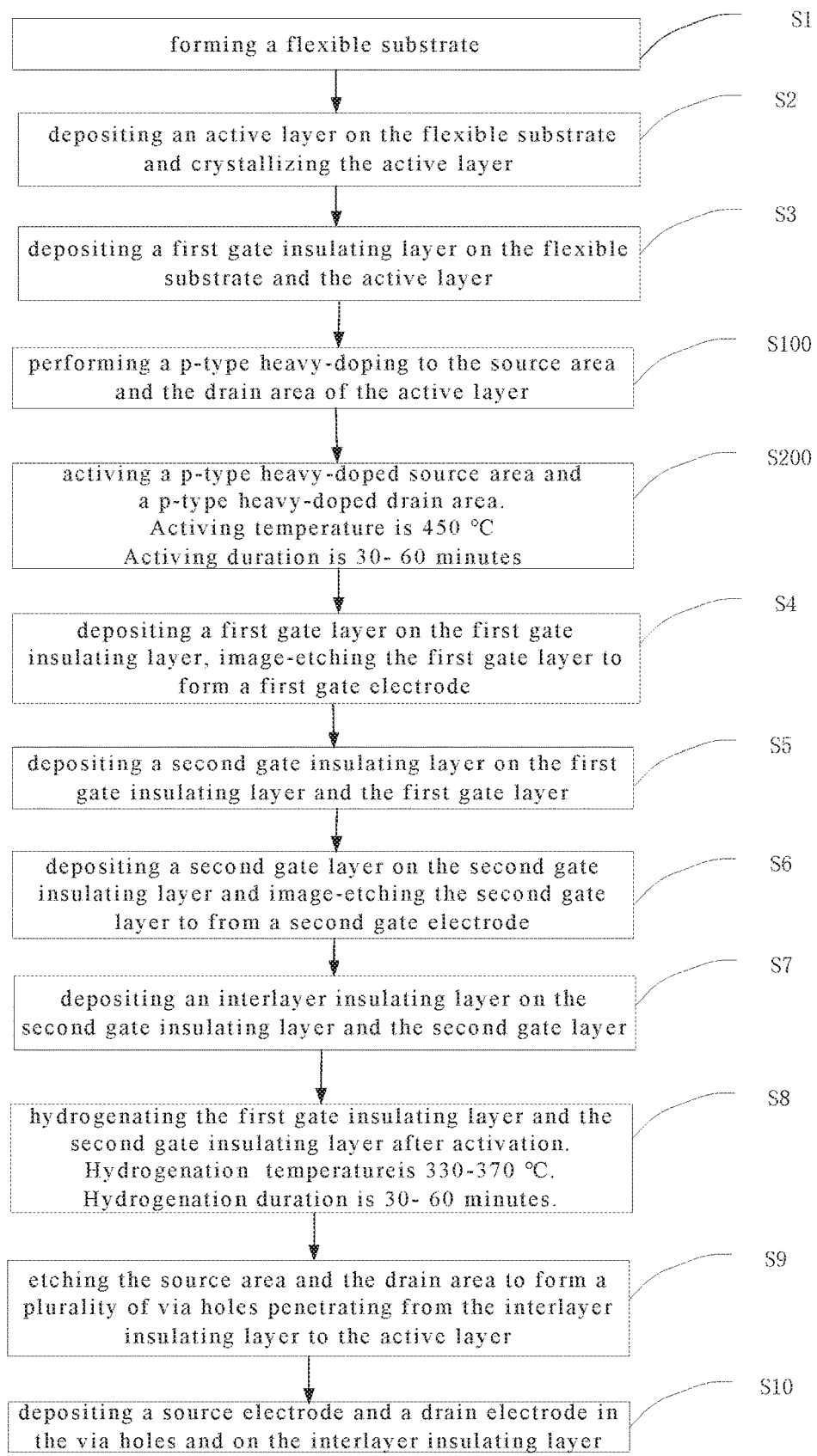
FIG. 4 is a flow chart for manufacturing an array substrate of an embodiment of the present disclosure.

Please refer to FIG. 4 accompanying with FIG. 1-3. The present disclosure also provides a method for forming the array substrate 10 which includes the following steps S1-S9 and steps S100-S200.

Step S1: Forming the flexible substrate 11. In the step of forming the flexible substrate 11, firstly a substrate is provided and a polyimide material is coated on the substrate to form a flexible base layer 111. A silicon oxide or silicon nitride material is deposited on the surface of the flexible base layer 111 to form a silicon oxide layer, a nitride oxide layer, or a multi-layered silicon nitride for forming the block layer 112.

Step S2: Depositing the active layer 12 on the flexible substrate 11 and crystallizing the active layer 12. The material for forming the active layer 12 is amorphous silicon (a-Si) and the active layer 12 is deposited by meteorological deposition.

Step S3: Depositing the first gate insulating layer 13 on the flexible substrate 11 and the active layer 12. The first gate insulating layer 13 is a silicon oxide layer, a nitride oxide layer, or a multi-layered silicon nitride. The first gate insulating layer 13 is deposited by a meteorological deposition.

Step S 100: Performing p-type heavily doping on the source area 121 and the drain area 122 of the active layer 12. Specifically, a first gate electrode mask is covered over the first gate insulating layer 13 and the p-type heavily doping is performed on the source area 121 and the drain area 122 of the active layer 12.

Step S200: Activating the source area 121 and the drain area 122 after P-type heavy doping is performed. The activation temperature is 450° C. The activation duration is 30-60 minutes.

The method for manufacturing the array substrate of the present disclosure advances the p-type heavily doping and activation processes (i.e., step S100 and step S200) prior to the deposition of the first gate layer 14 (i.e., step S4 illustrated below) to prevent the first gate layer 14 from impedance increasing caused by high activation temperature (the temperature is generally 450° C., the activation duration is 60 minutes). In the present embodiment, the p-type heavily doping is doped by the first gate mask therefore no extra masks are required.

Step S4: Depositing the first gate layer 14 on the first gate insulating layer 1, and the first gate layer 14 is etched to form a first gate electrode 14*a* (please refer to FIG. 1). The first gate layer 14 is a multi-layered composite metal layer 2. The first gate layer 14 is formed as a titanium-aluminum-titanium metal layered structure. The second gate insulating layer 15 is a silicon oxide layer, a nitride oxide layer, or a multi-layered silicon nitride. In the present embodiment, the first gate electrode 14*a* is formed by covering a first gate electrode mask over the first gate insulating layer 13 and lithography etching the first gate layer 14.

Step S5: Depositing the second gate insulating layer 15 on the first gate insulating layer 13 and the first gate layer 14.

Step S6: Depositing the second gate layer 16 on the second gate insulating layer 15. The second gate layer 16 is etched and patterned to form a second gate electrode 16*a* (please refer to FIG. 1). The second gate layer 16 is a multi-layered composite metal layer 2. The second gate layer 16 is formed as a molybdenum-aluminum-molybdenum metal layered structure. In the present embodiment, a second gate electrode mask is covered over the second gate insulating layer 15, and the second gate layer 16 is lithography etched to form the second gate electrode 16*a*.

Step S7: Depositing the interlayer insulating layer 17 on the second gate insulating layer 15 and the second gate layer 16. The interlayer insulating layer 17 is silicon oxide layer, nitride oxide layer, or multi-layered silicon nitride.

Step S8: Hydrogenation of the first gate insulating layer 13 and the second gate insulating layer 15 which activation had applied on. The hydrogenation temperature is 330-370° C. The hydrogenation duration is 30-60 minutes. In the present embodiment, the activation is mainly to rearrange the crystal structure of the active layer 12. Higher temperatures are required to dope ion elements uniformly for diffusing the lattice position in the doped region. Hydrogenation is to supplement the gate insulating layer with hydrogen in order to reduce the interface defects between the gate insulating layer and the active layer 12. The hydrogenation effect can be achieved with a relatively low temperature. The activation and hydrogenation processes are separated, that is, the activation is performed after the 9-type doping is completed, and the hydrogenation process is performed after the film formation of the interlayered insulating layer 17. Low-temperature, 330-370° C., is adopted during the hydrogenation process in order to prevent the first gate layer 14 from enduring continuously manufacturing process with high temperatures. In the meanwhile, effects of hydrogenation and activation of the array substrate 10 can be ensured.

Step S9: Penetrating the via-hole 101 from the interlayer insulating layer 17 to the active layer 12 by etching the source area 121 and the drain area 122. In the present embodiment, a via-hole 101 photomask is covered on the interlayer insulating layer 17 to form the via-hole 101 by lithography etching the source area 121 and the drain area 122.

Step S10: Depositing the source electrode 18 and the drain electrode 18 on the interlayer insulating layer 17 and in the via-hole 101.

In the present embodiment, the array substrate 10 may further include other devices or functional layers, such as an anode wires, a pixel defining layer etc. The improvements of the array substrate 10 of the present disclosure are improving the structure of the gate layer and changing the order of the hydrogenation and the activation steps for forming the gate layer. Therefore, other devices or functional layers, such as anode traces and pixel definition layers, are similar to the present technologies and will not be further described herein.

Figure 5:
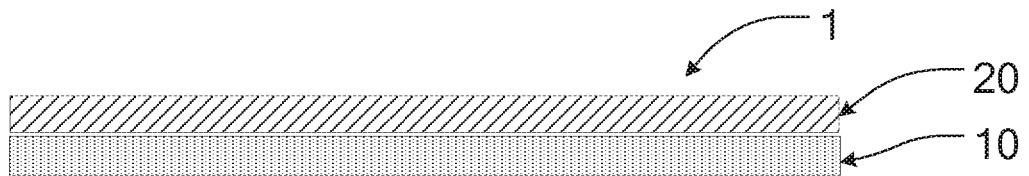
FIG. 5 illustrates a structure of a display panel of an embodiment of the present disclosure.

Please refer to FIG. 5. The present disclosure also provides a display panel 1 including the array substrate 10 and a color film substrate 20 disposed opposite to the array substrate 10. It is obvious that the display panel 1 of the present disclosure may further include a polarizer and other components. The main improvement of the display panel 1 of the present embodiment focuses on the array substrate 10 thus other devices, such as polarizers, are not described herein.

The above-mentioned context is only the preferred embodiment of the present disclosure and is not intended to limit the present disclosure. Any modifications, equivalent substitutions, or improvements base on the concepts and principles of the present disclosure shall be view as scopes protected by the present disclosure.

What is claimed is:

1. A method for manufacturing an array substrate, comprising:
   a step S1: forming a flexible substrate;
   a step S2: depositing an active layer on the flexible substrate and crystalizing the active layer;
   a step S3: depositing a first gate insulating layer on the flexible substrate and the active layer;
   a step S4: depositing a first gate layer on the first gate insulating layer, image-etching the first gate layer to form a first gate electrode, wherein the first gate layer is a multi-layered metal layer;
   a step S5: depositing a second gate insulating layer on the first gate insulating layer and the first gate layer; and
   a step S6: depositing a second gate layer on the second gate insulating layer and image-etching the second gate layer to from a second gate electrode; wherein the second gate layer is a multi-layered metal layer;
   wherein the active layer comprises a source area and a drain area, and the method further comprises the following steps between the step S3 and step S4;
   a step S100: performing a p-type heavy-doping to the source area and the drain area of the active layer; and
   a step S200: activating a p-type heavy-doped source area and a p-type heavy-doped drain area, wherein an activating temperature is 450° C. and an activating duration ranges between 30 minutes and 60 minutes;
   wherein the multi-layered metal layer comprises:
   a first metal layer;
   a second metal layer; and
   a third metal layer disposed between the first metal layer and the second metal layer; wherein the first metal layer and the second metal layer are composed of titanium or molybdenum, and the third metal layer is composed of aluminum.

2. A method for manufacturing an array substrate, comprising:
   a step S1: forming a flexible substrate;
   a step S2: depositing an active layer on the flexible substrate and crystalizing the active layer;
   a step S3: depositing a first gate insulating layer on the flexible substrate and the active layer;
   a step S4: depositing a first gate layer on the first gate insulating layer, image-etching the first gate layer to form a first gate electrode, wherein the first gate layer is a multi-layered metal layer;

a step S5: depositing a second gate insulating layer on the first gate insulating layer and the first gate layer; and a step S6: depositing a second gate layer on the second gate insulating layer and image-etching the second gate layer to from a second gate electrode; wherein the second gate layer is a multi-layered metal layer;

wherein the active layer comprises a source area and a drain area, wherein the method further comprises the following steps between the step S3 and step S4;

a step S100: performing a p-type heavy-doping to the source area and the drain area of the active layer; and a step S200: activating a p-type heavy-doped source area and a p-type heavy-doped drain area, wherein an activating temperature is 450° C. and an activating duration ranges between 30 minutes and 60 minutes.

3. The method for manufacturing the array substrate according to claim 2, further comprising the following steps after the step S6:

a step S7: depositing an interlayer insulating layer on the second gate insulating layer and the second gate layer;

a step S8: hydrogenating the first gate insulating layer and the second gate insulating layer after activating the first gate insulating layer and the second gate insulating layer, wherein a hydrogenation temperature ranges between 330° C. and 370° C., and a hydrogenation duration ranges between 30 minutes and 60 minutes;

a step S9: etching the source area and the drain area to form a plurality of via holes penetrating from the interlayer insulating layer to the active layer; and a step S10: depositing a source electrode and a drain electrode in the via holes and on the interlayer insulating layer.

4. A method for manufacturing an array substrate, comprising:

a step S1: forming a flexible substrate;

a step S2: depositing an active layer on the flexible substrate and crystalizing the active layer;

a step S3: depositing a first gate insulating layer on the flexible substrate and the active layer;

a step S4: depositing a first gate layer on the first gate insulating layer, image-etching the first gate layer to form a first gate electrode, wherein the first gate layer is a multi-layered metal layer;

a step S5: depositing a second gate insulating layer on the first gate insulating layer and the first gate layer; and a step S6: depositing a second gate layer on the second gate insulating layer and image-etching the second gate layer to from a second gate electrode; wherein the second gate layer is a multi-layered metal layer;

wherein the multi-layered metal layer comprises:

a first metal layer;

a second metal layer; and a third metal layer disposed between the first metal layer and the second metal layer;

wherein the first metal layer and the second metal layer are composed of titanium or molybdenum, the third metal layer is composed of aluminum.

* * * * *